United States Patent
Vigna et al.

(10) Patent No.: US 6,469,330 B1
(45) Date of Patent: Oct. 22, 2002

(54) PROCESS FOR MANUFACTURING INTEGRATED DEVICES COMPRISING MICROSTRUCTURES AND ASSOCIATED SUSPENDED ELECTRICAL INTERCONNECTIONS

(75) Inventors: Benedetto Vigna, Pietrapertosa; Ubaldo Mastromatteo, Bereggio, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/422,049

(22) Filed: Oct. 20, 1999

(30) Foreign Application Priority Data

Oct. 21, 1998 (EP) .............................. 98830629

(51) Int. Cl.⁷ .............................. H01L 27/20
(52) U.S. Cl. ................. 257/254; 257/522; 438/50; 438/411
(58) Field of Search .................. 438/48–54, 411, 438/421, 619; 257/522, 254

(56) References Cited

U.S. PATENT DOCUMENTS

| | | | |
|---|---|---|---|
| 5,148,260 A | | 9/1992 | Inoue et al. .................. 357/67 |
| 5,531,018 A | | 7/1996 | Saia et al. .................... 29/622 |
| 5,883,009 A | * | 3/1999 | Villa et al. ................... 438/739 |
| 5,907,765 A | * | 5/1999 | Lescouzeres et al. .......... 438/49 |
| 5,981,308 A | * | 11/1999 | Lee .............................. 438/52 |
| 6,109,106 A | * | 8/2000 | Ferrari et al. ............. 73/514.32 |
| 6,184,051 B1 | * | 2/2001 | Ferrari et al. ................. 438/48 |
| 6,211,056 B1 | * | 4/2001 | Begley et al. ............... 438/619 |
| 6,227,049 B1 | * | 5/2001 | Fujii ....................... 73/514.18 |

FOREIGN PATENT DOCUMENTS

| | | |
|---|---|---|
| DE | 2 001 468 | 7/1971 |
| EP | 0 826 967 A1 | 3/1998 |
| GB | 1153052 | 5/1969 |

OTHER PUBLICATIONS

S. Sugiyama et al., Surface Micromachined Micro–Diaphragm Pressure Sensors. IEEE 1991, pp. 188–191.*

L. Tong et al., Amorphous Silicon Carbide Films by Plasma–Enhance Chemical Vapor Deposition. IEEE, 1993, pp. 242–247.*

A. J. Fleischman et al., Polycrystalline Silicon Carbide for Surface Micromachining. IEEE 1996, pp. 234–238.*

J. H. Smith et al., Embedded Micromechanical Devices for the Monolithic Integration of MEMS with CMOS. IEEE, 1995, pp. 609–612.*

Goosen et al., "Problems of Sacrificial Etching in a Combined Micromachining and Electronic Process," in *Proceedings 1996 National Sensor Conference*, Delft, The Netherlands, Mar. 20–21, 1996, pp. 193–196.

* cited by examiner

Primary Examiner—Olik Chaudhuri
Assistant Examiner—Anh Duy Mai
(74) Attorney, Agent, or Firm—Seed Intellectual Property Law Group PLLC; Lisa K. Jorgenson; Robert Iannucci

(57) ABSTRACT

An integrated device comprises an epitaxial layer forming a first and a second region separated by at least one air gap. The first region forms, for example, a suspended mass of an accelerometer. A bridge element extends on the air gap and has a suspended electrical connection line electrically connecting the first and the second region and a protective structure of etch-resistant material, which surrounds the electrical connection line on all sides. The protective structure is formed by a lower portion of silicon nitride and an upper portion of silicon carbide, the silicon carbide surrounding the electrical connection line at the upper and lateral sides.

5 Claims, 5 Drawing Sheets

PROCESS FOR MANUFACTURING INTEGRATED DEVICES COMPRISING MICROSTRUCTURES AND ASSOCIATED SUSPENDED ELECTRICAL INTERCONNECTIONS

TECHNICAL FIELD

The invention relates to a process for manufacturing integrated devices comprising microstructures and associated suspended electrical interconnections.

BACKGROUND OF THE INVENTION

As known, integrated structures have been recently proposed formed from a semiconductor material body and comprising suspended masses connected to the rest of the wafer by support regions and electrical connection regions. Such microstructures are used to produce, for example, accelerometers and sensors of various types (gas, pressure etc.) and microactuators. Generally, electrical connection regions are buried and formed by polysilicon strips surrounded by two insulating layers or by conductive regions formed in the starting substrate.

Two examples of buried connections are shown in FIGS. 1 and 2 and will be described below, for a better understanding.

FIG. 1 shows a wafer 1 of semiconductor material comprising a substrate 2 of single-crystal silicon and an epitaxial layer 3. A suspended mass 4 (defining an accelerometer for example) comprising an electrical connection portion 5 at the bottom is formed inside the epitaxial layer 3. The electrical connection portion 5 is in direct electrical contact with a buried connection line 6, typically of multi-crystal silicon, which connects the suspended mass 4 to an epitaxial region 10. The suspended mass 4, the buried connection line 6, and the epitaxial region 10 have the same electrical conductivity type, N for example, whereas the substrate 2 has P-type conductivity, for example. The electrical connection line 6 extends on substrate 2 and is electrically isolated from it by a first oxide layer 11. A second oxide layer 12 also isolates the electrical connection line 6 from the epitaxial layer 3 except at the contact with the epitaxial region 10 and at the suspended mass 4, where the oxide layer 12 has been removed to free the suspended mass 4.

In the solution of FIG. 2 the buried connection line, now denoted by 15, is formed inside the substrate 2 to form a diode 16. In this solution the first oxide layer 11 is not present but the second oxide layer 12 may be present. By biasing the substrate 2 at a voltage that is always lower than the voltage of the suspended mass 4, and therefore lower than the buried connection line 15 (by connecting the substrate 2 to ground and the regions 4, 15 and 10 to a positive voltage, for example), the diode 16 is reverse-biased and defines a junction isolation.

The buried connections described above have many disadvantages mainly due, as regards the solution of FIG. 1, to inadequate breakdown voltage of insulating oxide layers 11 and 12, and as regards the solution of FIG. 2, possible losses of diode 16 towards the substrate 2 and possible triggering of parasitic components formed by adjacent connection lines and inadequate reverse breakdown voltage of diode 16. Furthermore, in both cases, the connection lines 6, 15 are exposed while etching the sacrificial layer to enable the suspended mass 4 to be freed.

Suspended connection lines also have been already proposed, but considerable problems have been encountered in producing them. In fact they cannot be produced at the end of the process, after the suspended mass has been freed. On the other hand, the excavation operations to free the suspended mass run the risk of damaging them.

SUMMARY OF THE INVENTION

An advantage of the invention is therefore to provide a manufacturing process to address the above problems.

An embodiment of the invention provides a process for manufacturing an integrated device and an integrated device thus produced, as defined in the claims.

BRIEF DESCRIPTION OF THE DRAWINGS

For understanding the invention, an embodiment will now be described, purely by way of a non-exhaustive and non-limiting example, with reference to the accompanying drawings wherein.

DETAILED DESCRIPTION OF THE ILLUSTRATED EMBODIMENTS

Figure 3:
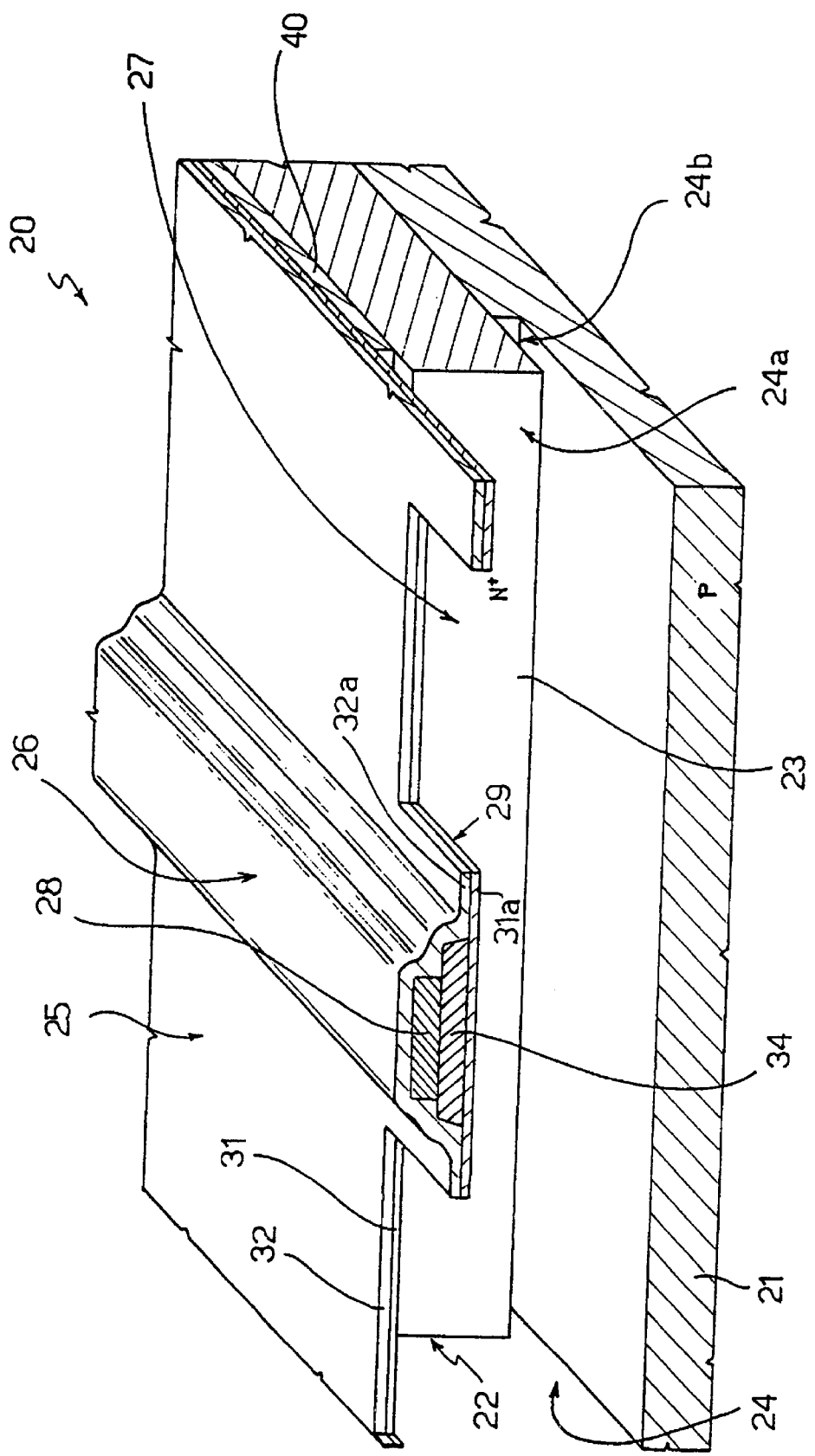
FIG. 3 shows a cross-sectional perspective view through an integrated device according to an embodiment of the invention.

FIG. 3 shows part of a wafer 20 comprising a substrate 21, of P-type here, and an epitaxial layer 22, of N-type here, defining a suspended mass 23. In the portion shown, epitaxial layer 22 is partially removed and an opening 24 separates the suspended mass 23 from the rest of the epitaxial layer 22. In particular, the opening 24 comprises a trench 24a extending over all the thickness of the epitaxial layer 22 and a lower portion 24b extending between substrate 21 and suspended mass 23, formed by removing a sacrificial layer, as described in detail below.

Figure 4:
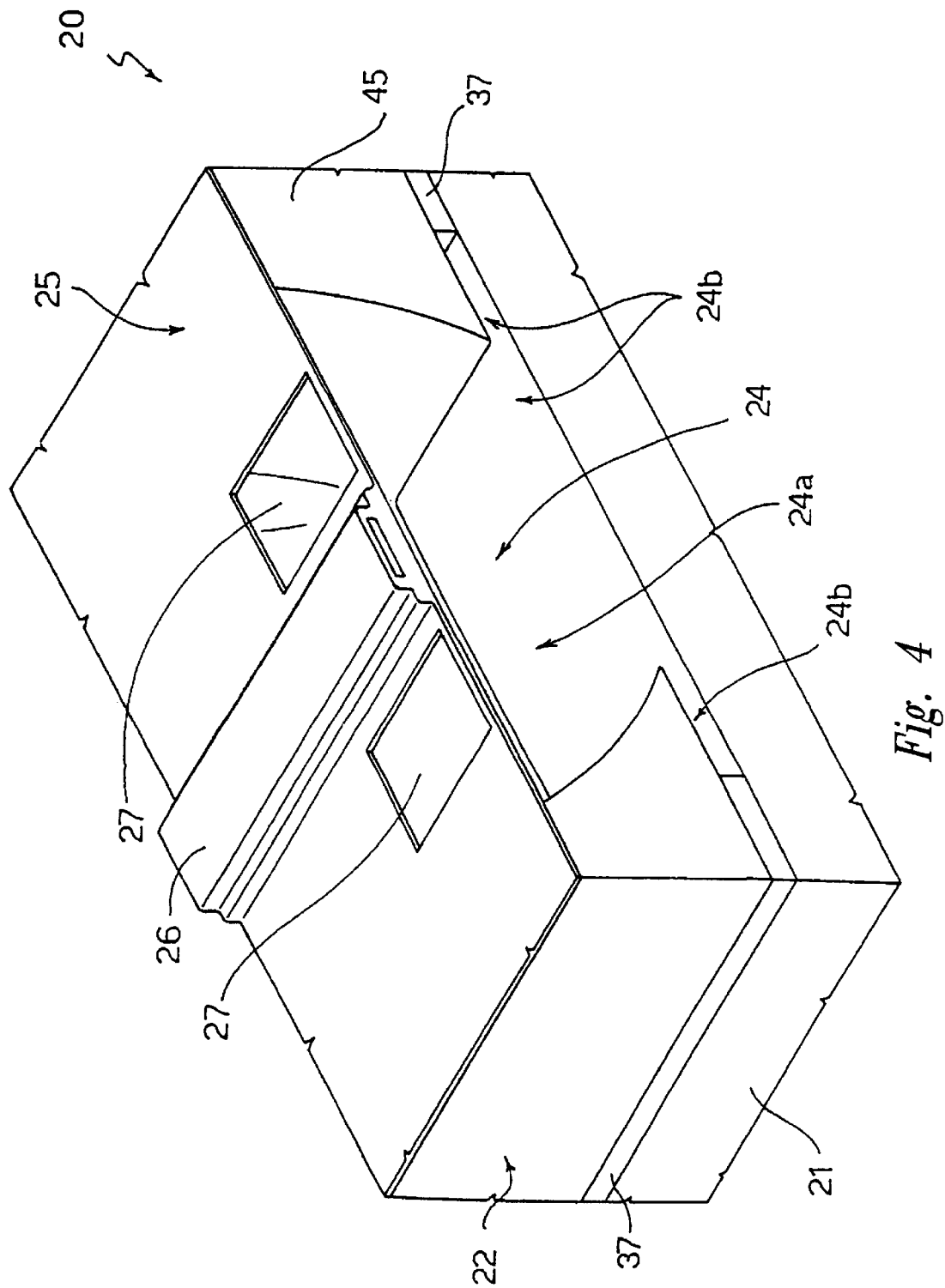
FIG. 4 shows a cross-sectional perspective view, in the direction opposite to that of FIG. 3, on a smaller scale.

An insulating structure 25 formed by a plurality of superimposed layers and having holes 27 extends on the epitaxial layer 22. The insulating structure 25 forms a bridge element 26 comprising an electrical connection line 28 and a protective structure 29 surrounding the electrical connection line 28 for protection and support. In detail, the insulating structure 25 comprises a lower layer 31 of silicon nitride and an upper layer 32 of silicon carbide. At the bridge element 26, the lower 31 and upper 32 layers form a lower protective region 31 a and an upper protective region 32a. An insulating region 34, of silicon oxide, extends between the lower protective region 31a and the electrical connection line 28. The electrical connection line 28 is made of aluminum, for example, and electrically connects the suspended mass 23 to a fixed region 45 (FIG. 4). In alternative embodiments, the electrical connection line 28 can comprise a sufficiently doped material. At the suspended mass 23, the insulating structure 25 further comprises an oxide layer 40 (field oxide, for example).

FIG. 4 shows the insulating structure 25 of FIG. 3 in the direction of the fixed regions of wafer 20. In particular, an oxide layer 37 extends between substrate 21 and epitaxial layer 22 and is removed at the lower portion 24b of the opening 24. The shape of two holes 27 is also visible. In this drawing, the stratified structure of the insulating structure 25 is not shown for reasons of simplicity.

An example of the manufacturing steps of the insulating structure 25 and the electrical connection line 28 will now be described with reference to FIGS. 5a–5i.

First the usual initial steps for forming the wafer are carried out. In this respect, the example shown uses a wafer comprising a sacrificial material layer or at least portions 37, typically of silicon oxide, between substrate 21 and epitaxial layer 22. Alternatively it is also possible to use a so-called SOI (Silicon-on-Insulator) substrate formed by two silicon substrates separated by an insulating material layer (such as silicon oxide).

The steps necessary to produce integrated components are then carried out, in per se known manner and not described in detail, as far as the production of the last diffusion inside the epitaxial layer 22. In particular, oxide regions, such as field oxide regions 40, are formed in the zones of the wafer where suspended structures are to be formed.

Figure 5A:
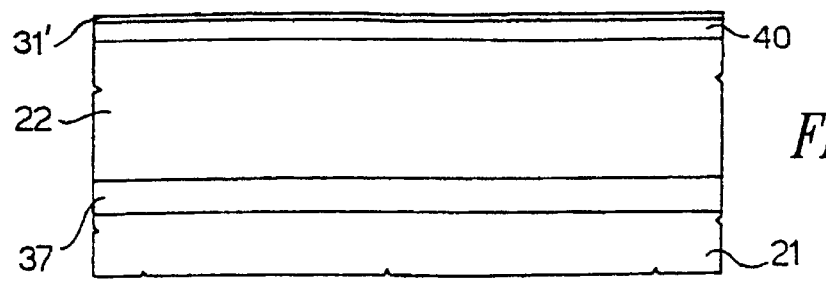
FIGS. 5a–5i show cross-sections through the wafer of FIG. 3, in successive manufacture steps.
Figure 5B:
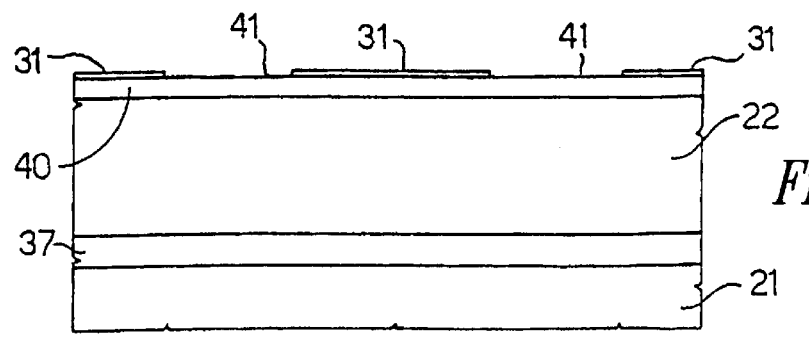
Figure 5C:
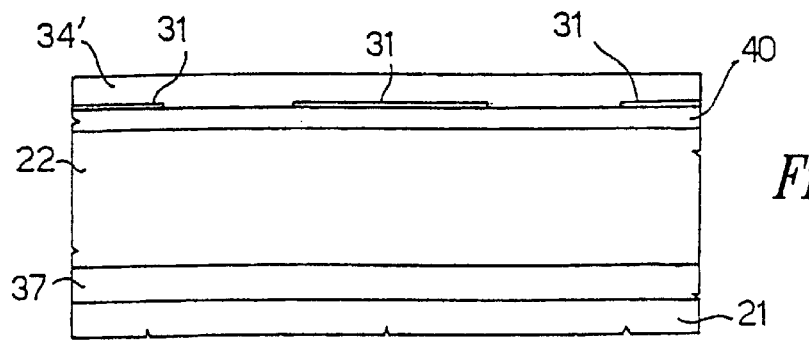
Figure 5D:
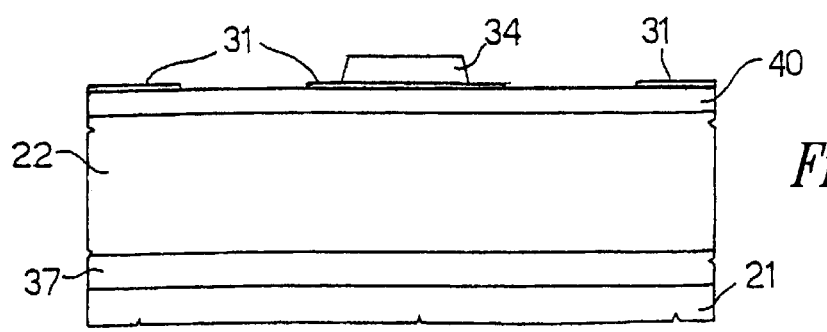

Then, with reference to FIG. 5a, a silicon nitride layer 31' is deposited and overlaps the field oxide region 40 in the region where the suspended structure is to be formed. The nitride layer 31' is then masked and removed selectively in the zones where holes 27 (openings 41) are to be formed. The nitride layer remains, however, where the insulating structure 25 is to be formed, defining the lower layer 31 (FIG. 5b). A protective dielectric layer 34' (FIG. 5c), such as BPSG (Boron Phosphorous Silicon Glass), is deposited and then shaped to form the insulating region 34 (FIG. 5d). A contact mask is then formed (not shown).

Figure 5E:
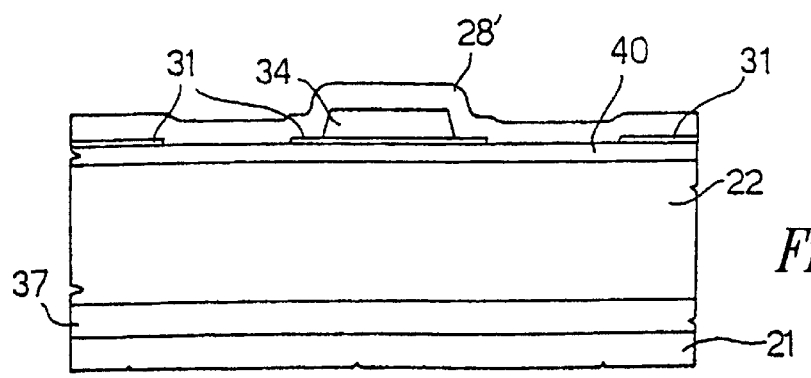
Figure 5F:
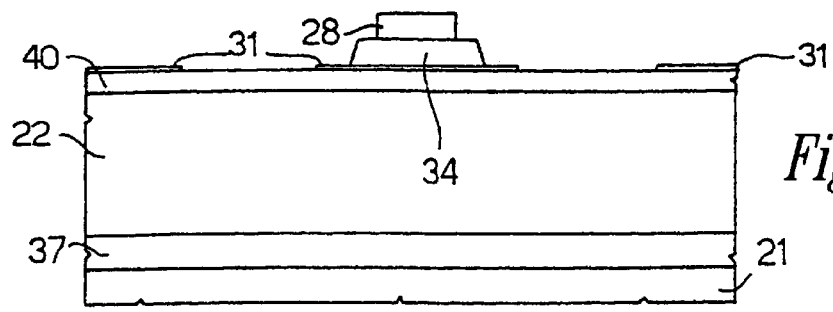
Figure 5G:
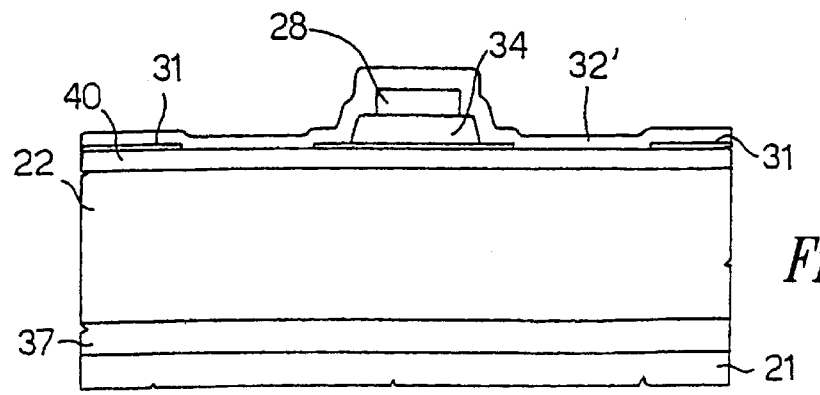
Figure 5H:
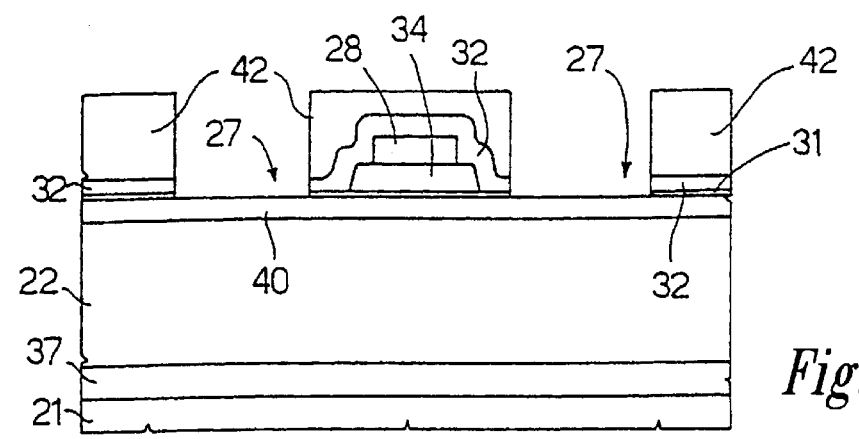
Figure 5I:
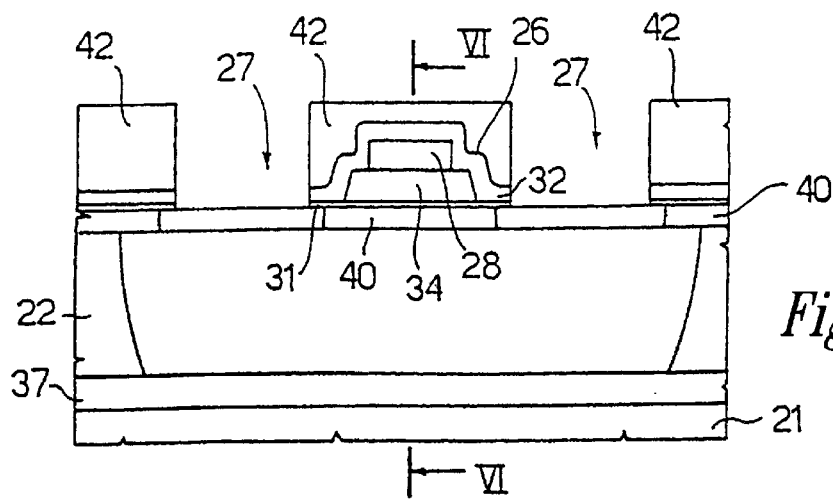

A conductive layer 28' of aluminum, for example, is then deposited(FIG. 5e). The conductive layer 28' is then shaped to form the connection lines of the devices integrated in the wafer 20, including the electrical connection line 28, and the contacts (not shown), obtaining the structure of FIG. 5f. A silicon carbide layer 32' is then deposited (FIG. 5g). The silicon carbide layer 32' is then defined using a suitable resist mask 42, forming the upper layer 32 (FIG. 5h). The openings 27 are formed in this step.

Field oxide region 40 is then etched using resist mask 42 and then epitaxial layer 22 is isotropically etched. In this step, given the etching isotropy, the epitaxial layer 22 is removed not only underneath the openings 27 but also laterally and, in particular, on bridge element 26 (FIG. 5i), forming the opening 24. Furthermore, even if etching the silicon material of epitaxial layer 22 requires a good deal of time and the resist mask 42 is not sufficiently resistant, the insulating structure 25 ensures the protection of the structures beneath. In particular it ensures that the electrical connection line 28 is not damaged. A number of technological steps (masking and etching) are then carried out to define, inside the suspended mass 23, an integrated microstructure that is to be connected by the electrical connection line 28. In this step it is possible to mask the wafer using a photo-sensitive stick foil, or a non-liquid adhesive material that adheres to the wafer surface and may be shaped by conventional photolithographic techniques, in a manner similar to photoresist. By being non-liquid, the adhesive material covers the opening 24 without entering it.

Finally, the sacrificial material layer 37 is etched, by hydrofluoric acid solution, for example, to free the suspended mass 23. In this step, the field oxide region 40 is also removed underneath the bridge element 26 and the insulating structure 25, where exposed. The final structure shown in FIG. 6 is thus obtained.

Figure 1:
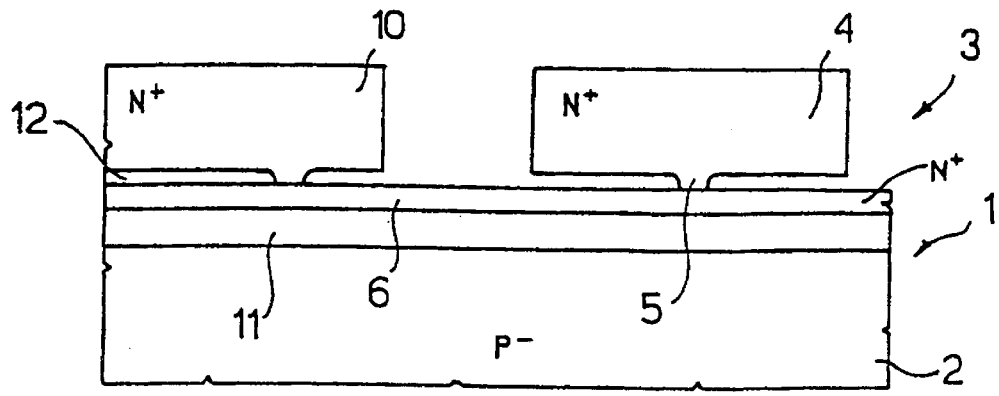
FIG. 1 shows a cross-section through a wafer incorporating a suspended mass with electrical connections of a known type.
Figure 2:
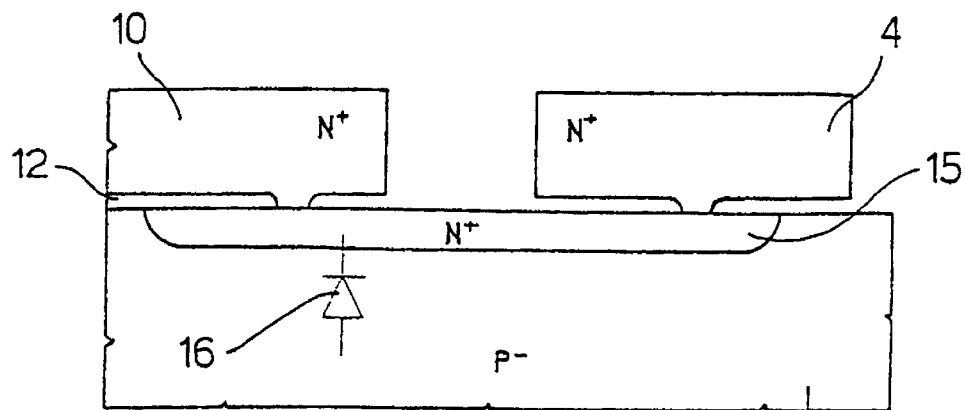
FIG. 2 shows a cross-section similar to FIG. 1, relating to a different known solution.
Figure 6:
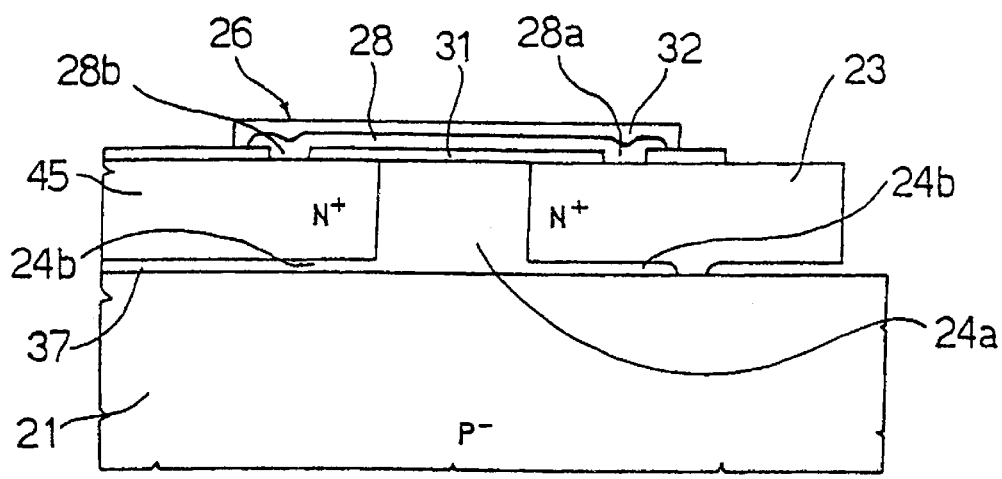
FIG. 6 shows a cross-section taken along a plane perpendicular to that of FIG. 5i, according to line VI—VI, in a successive manufacture step.

In particular, FIG. 6 shows the connection between the suspended mass 23 and the fixed region 45 through the electrical connection line 28. For reasons of simplicity, this drawing does not show the insulating region 34 and the field oxide region 40. As will be noted, the electrical connection line 28 has ends 28a, 28b extending beyond the bridge element 26 and in direct contact with the suspended mass 23 and with the fixed region 45, respectively.

The advantages of the described device and the process are as follows. First, the suspended electrical connection line 28 is not subject to the disadvantages described above with respect to buried connections. Furthermore, the electrical connection line 28 is protected both during etching to free the suspended mass 23 and subsequently from the external environment and so it retains its functionality even in case of humidity, oxidizing atmospheres or other causes of degradation.

In particular, the insulating region 34 of silicon oxide on the lower layer 31 of silicon nitride ensures the necessary voltage confinement in zones where the connection line 28 runs on the epitaxial layer 22. The use of nitride as lower layer 31 of the insulating structure 25 enables the lower layer 31 to be deposited on the epitaxial layer 22 (and on any dielectric layers present, such as the field oxide region 40). The use of carbide as upper layer 32 of the insulating structure 25 ensures, in many conditions, the protection of the electrical connection line 28 during etching of the epitaxial layer 22 and the sacrificial layer 37, as noted above. Furthermore, suspended connections simplify the packaging operations of the integrated device.

Finally, it will be clear that many modifications and variants may be introduced to the process and the device described and illustrated herein, all of which come within the scope of the invention, as defined in the accompanying claims. In particular, the materials of the protective structure may be different from the described ones. For instance, if the lower layer has the necessary electrical properties and/or the device operates at low voltages, it is possible to omit the insulating region 34. Furthermore, the insulating structure 25 may be provided only at the bridge element 26, and may be removed elsewhere. The suspended mass 23 may be freed and etched differently, for example, by excavating the epitaxial silicon and removing suitable sacrificial regions. Finally, the process is applicable not only to suspended masses intended for electromechanical functions but it may also be used for regions separated from adjacent regions through excavations that are not filled and therefore are surrounded by air gaps, wherein electrical connections to the adjacent regions are necessary. Therefore, the scope of the invention is not limited by the description herein, but instead the scope is to be defined by the following claims, which are to be construed in accordance with established doctrines of claim interpretation.

What is claimed is:

1. An integrated device, comprising:
   a semiconductor body having first and second regions separated by an air gap;
   a conductive line extending over the air gap, the conductive line electrically connecting the first and second regions; and
   a protective structure at least partially surrounding the conductive line wherein the protective structure includes an upper protective region comprising silicon carbide.

2. An integrated device, comprising:

a semiconductor body having first and second regions separated by an air gap;

a conductive line extending over the air gap, the conductive line electrically connecting the first and second regions; and a protective structure at least partially surrounding the conductive line wherein the protective structure further comprises a lower protective region comprising a silicon nitride portion.

3. An integrated device, comprising:

a semiconductor body having first and second regions separated by an air gap;

a conductive line extending over the air gap, the conductive line electrically connecting the first and second regions;

a protective structure at least partially surrounding the conductive line; and an insulating region disposed beneath the conduction line and wherein the protective structure includes a lower protective region disposed beneath the insulating region.

4. An integrated device, comprising:

a semiconductor material body including a first and a second region adjacent to and separated by an air gap;

a bridge element including a suspended electrical connection line extending between said first and said second regions on said air gap and electrically joining said first and second regions; and a protective structure of etch-resistant material, surrounding said electrical connection line, said protective structure including a lower protective region and an upper protective region both of electrically insulating material and surrounding said electrical connection line, said electrical connection line having a first and a second end in direct electrical connection with said first and said second regions, respectively, said lower protective region having a silicon nitride portion, said upper protective region having a silicon carbide portion.

5. An integrated device, comprising:

a semiconductor material body housing a first and a second region separated by at least one air gap;

a bridge element including a suspended electrical connection line extending between said first and said second regions on said air gap and electrically joining said first and second regions;

a protective structure of etch-resistant material, surrounding said electrical connection line, said protective structure comprising a lower protective region and an upper protective region both of electrically insulating material and surrounding said electrical connection line, said lower protective region comprising a silicon nitride portion, said electrical connection line having a first and a second end in direct electrical connection with said first and said second regions, respectively; and a region of silicon oxide disposed between said silicon nitride portion and said electrical connection line.

* * * * *